US011863318B2

(12) United States Patent
Liu et al.

(10) Patent No.: US 11,863,318 B2
(45) Date of Patent: Jan. 2, 2024

(54) ERROR CORRECTION FOR NETWORK PACKETS

(71) Applicant: FRONTIIR PTE LTD., Singapore (SG)

(72) Inventors: Changbin Liu, Singapore (SG); Boon Thau Loo, Singapore (SG)

(73) Assignee: FRONTIIR PTE LTD., Singapore (SG)

( * ) Notice: Subject to any disclaimer, the term of this patent is extended or adjusted under 35 U.S.C. 154(b) by 0 days.

(21) Appl. No.: 17/008,446

(22) Filed: Aug. 31, 2020

(65) Prior Publication Data

US 2022/0069942 A1 Mar. 3, 2022

(51) Int. Cl.
*H04L 1/00* (2006.01)
*H04L 67/1097* (2022.01)
*H04L 69/16* (2022.01)

(52) U.S. Cl.
CPC ........ *H04L 1/0061* (2013.01); *H04L 67/1097* (2013.01); *H04L 69/16* (2013.01)

(58) Field of Classification Search
CPC ... H04L 1/0061; H04L 67/1097; H04L 69/16; H04L 1/0041; H04L 1/0057; H03M 13/373
See application file for complete search history.

(56) References Cited

U.S. PATENT DOCUMENTS

| | | | | |
|---|---|---|---|---|
| 7,151,754 B1* | 12/2006 | Boyce | ............... | H03M 13/1515 370/328 |
| 9,372,870 B1* | 6/2016 | Levy | ............. | G06F 11/1004 |
| 10,778,813 B2* | 9/2020 | Chiang | ............... | H04L 41/0836 |
| 2004/0243913 A1* | 12/2004 | Budge | .................. | A61B 6/5282 714/776 |
| 2005/0091412 A1* | 4/2005 | Pinkerton | ............. | H04L 69/165 709/250 |
| 2007/0011556 A1* | 1/2007 | Gentric | ................. | H04L 1/0057 714/752 |
| 2009/0154495 A1* | 6/2009 | Ojala | .................... | H04L 1/0061 370/469 |
| 2011/0252083 A1* | 10/2011 | Ranney | ................... | H04L 69/14 709/230 |
| 2011/0252292 A1* | 10/2011 | Bose | ..................... | H04L 1/0057 714/776 |
| 2012/0117443 A1* | 5/2012 | Lee | ....................... | H04L 1/0061 714/E11.03 |
| 2013/0286875 A1* | 10/2013 | Morrill | ................ | H04L 43/065 370/252 |
| 2016/0198021 A1* | 7/2016 | Mooney | ............... | H04L 69/165 370/467 |

(Continued)

*Primary Examiner* — Albert Decady
*Assistant Examiner* — Enamul M Kabir
(74) *Attorney, Agent, or Firm* — Womble Bond Dickinson (US) LLP

(57) ABSTRACT

In one embodiment, a method is provided. The method includes receiving a request for a first set of data stored on a data storage system from a computing device. The method also includes retrieving the first set of data from a data storage device of the data storage system. The method further includes generating a set of codewords based on the first set of data and an error correction code. The method further includes transmitting a set of network packets to the computing device. Each network packet of the set of network packets comprises a codeword from the set of codewords.

12 Claims, 11 Drawing Sheets

(56) References Cited

U.S. PATENT DOCUMENTS

| | | | |
|---|---|---|---|
| 2017/0126363 A1* | 5/2017 | Wang | H04L 1/20 |
| 2017/0142562 A1* | 5/2017 | Stewart | H04W 4/12 |
| 2017/0308434 A1* | 10/2017 | Cronie | H04L 67/1097 |
| 2018/0124218 A1* | 5/2018 | Koster | H04L 69/18 |
| 2019/0068512 A1* | 2/2019 | Papaloukopoulos | H04L 45/00 |
| 2019/0229844 A1* | 7/2019 | Coulombe | H04L 1/0061 |
| 2020/0045147 A1* | 2/2020 | Chiang | H04L 65/1016 |
| 2020/0252158 A1* | 8/2020 | Shen | H04L 1/0041 |
| 2020/0382236 A1* | 12/2020 | Lee | G08G 1/165 |
| 2021/0141685 A1* | 5/2021 | Li | G06F 11/106 |
| 2021/0306676 A1* | 9/2021 | Meardi | H04N 19/122 |
| 2022/0116149 A1* | 4/2022 | Yang | H04L 1/0008 |

\* cited by examiner

ERROR CORRECTION FOR NETWORK PACKETS

TECHNICAL FIELD

Aspects of the present disclosure relate to network packets, and more particularly, to error correction for network packets.

BACKGROUND

Client devices (e.g., computing devices such as smartphones, laptop computers, tablet computers, etc.), applications, server computers, etc., may store data on data storage devices and/or data storage systems. The client devices, applications, server computers, etc., may access the data to perform various functions, operations, actions. For example, a video analysis application or model (e.g., a machine learning model) may access video data that is stored on the data storage devices and/or data storage systems.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
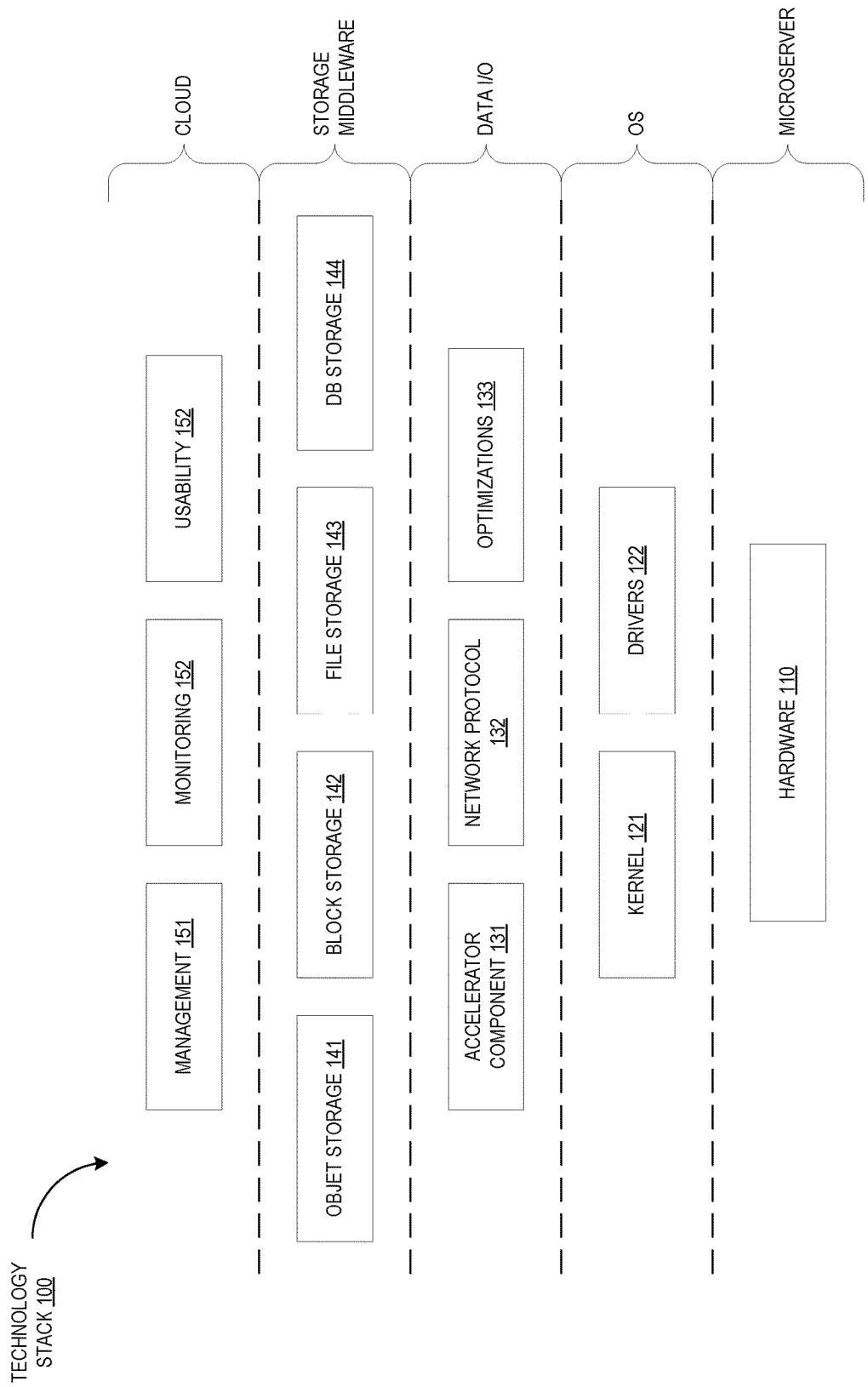
FIG. 1 is a block diagram that illustrates an example technology stack, in accordance with some embodiments of the present disclosure.

As discussed above, client devices, applications, server computers, etc., may store data on data storage devices and/or data storage systems. The client devices, applications, server computers, etc., may access the data to perform various functions, operations, actions. The data storage systems may use solid state drives (SSDs, flash memory) as data storage devices. SSDs provide high performance but at a higher cost. For example, SSDs may be an order of magnitude more expensive than hard disk drives (HDDs, magnetic disk drives).

The data that is accessed by client devices, servers, applications, etc., may be stored in a public cloud (e.g., cloud storage). Public cloud storage may be expensive, particularly if large amounts of data are stored in the public cloud. For example, a cloud storage provider may charge for both storing the data and for data traffic (e.g., for reading and/or writing the data to the cloud). In addition, because many public clouds use virtual environments (e.g., virtual machines, containers, etc.), performance may not be guaranteed in a public cloud. Storing data in a public cloud may also result in privacy issues when dealing with sensitive customer data.

Private clouds are another option for storing data. For example, a company may buy hardware/software to set up their own private cloud for storing data. Private clouds typically use x86-based hardware/software solutions, which may be more expensive and may not achieve good performance. In addition, storage appliances used in data centers may hit performance bottlenecks due to x86 server architectures that introduce contention on various resources such as the central processing unit (CPU), memory, and network/disk controllers. This often results in I/O throughput saturation of around 10 MBps per hard drive. Other cheap alternatives that are based on cold storage approaches exist (e.g. storing on tapes or Write-Once Read-Many (WORM) optical disks) but these alternatives are best used for data archival and not for running real-time big data analytics.

In one embodiment, a storage microserver architecture is provided. The storage microserver architecture may result in significantly lower cost (e.g., both hardware costs and power consumption) and may have similar or better I/O performance and/or reliability when compared to commodity x86 servers. In one embodiment, the microservers (e.g., the storage microservers) may use Advanced RISC Machines (ARM) processors and/or coprocessors. The ARM processors/coprocessors may be integrated onto a system on a chip (SoC).

The system architecture (e.g., the storage microserver architecture) may use software modifications that are optimized for ARM-based microservers. This may allow the microservers to deliver significantly high I/O performance when compared to alternatives that run generic unmodified software customized for x86 servers. In addition, the system architecture may provide fully integrated storage solution that includes backend storage systems, management, and monitoring systems.

The system architecture and/or the microservers described herein may reduce costs due to lower hardware costs (e.g., ARM processors may be cheaper than x86 processors) and reduce power consumption. The microservers may also provide improved I/O performance that can lead to improvements in user experiences for their customers and reduced downtime due to faster recovery and better reliability. The microservers may have a hardware architecture that deploys commodity disks in a more compact chassis. The microservers may help avoid CPU, memory bus, and I/O contention that plague traditional storage solutions. Various software on the microservers, such as the kernel, device drivers, and an accelerator (e.g., an I/O accelerator) may be designed and/or configured for ARM-based microservers. The system architecture may also include middleware and cloud-based infrastructure to handle object storage, block storage, file system storage, and database storage, etc.

FIG. 1 is a block diagram that illustrates an example technology stack 100, in accordance with some embodiments of the present disclosure. The technology stack includes the following layers: the microserver, the OS, data I/O, storage middleware, and cloud. As discussed above, at the microserver layer, ARM-based storage microservers may be used to provide reliable, high-performance storage. A microserver may include various hardware 110. For example, a single microserver may include an ARM based SoC. The SoC may include an ARM processor (e.g., a primary processing device) and one or more ARM coprocessors (e.g., one or more secondary processing devices). ARM processors may include 32-bit and 64-bit RISC processors. Other examples of hardware 110 may include dual 1 Gbps Ethernet network interface cards (NIC) for redundancy and multiple disk drives (e.g., 2 HDDs). The microservers can be stacked together into a chassis configuration and inter-connected via an Ethernet switch. The microserver may be cheaper because the ARM processors may be cheaper than traditional x86 processors/hardware. In addition, ARM-based processors may consume less power than a processor based on x86 chip-set. Furthermore, an ARM based SoC may use less board space (e.g., may use smaller printed circuit boards (PCB)s). This results in higher storage density and physical space efficiency in data centers. In addition, because a microserver may include fewer disk drives, the failure of a microserver impact fewer disks (e.g., one or two disks) when compare with a x86 server which may often have 8, 16, up to 72 disk drives. ARM based SoC boards may also include less hardware components than x86 servers (e.g., no CPU fan, no video card, no Northbridge/Southbridge chips, etc.). Fewer components may increase the reliability of the microserver.

At the OS layer, a microserver may use a Linux OS with enhancements to help optimize its performance for ARM-based processor. The drivers 122 may include special device drivers are used to optimize for raw I/O performance of disk and network controllers.

At the data I/O layer, there may be additional software that communicates with the hardware/software of the microserver. For example, an accelerator component 131 may speed up I/O performance. Various network protocols 132 may be used to reduce communication overhead between the microserver and other computing devices. Optimizations 133 may include storage related optimizations (memory zero-copy, threads parallelization and pipelining, data checksum computation offload, and accurate resource scheduling) to improve I/O performance (e.g., performance when reading and/or writing data).

In one embodiment, the accelerator component 131 may span across kernel space and user space and may bridge the I/O gap between storage software and the capacities provided by lower-level hardware. The accelerator component 131 may maximize resource utilization on the microserver while avoiding bottleneck in CPU cycles, memory access, disk read/write, and network packet send/receive. For example, the accelerator component 131 may run multiple threads to parallelize the access to CPU, memory, network and disk. The accelerator component 131 may also control resource allocation and deallocation, while coordinating resource occupation among threads. To reduce CPU cycles and memory footprint, the accelerator component 131 may adopt zero-copy techniques to create mapped memory directly into kernel so as to avoid copying memory between kernel and user space and device buffers.

For more efficient disk reads/writes, the accelerator component 131 utilizes raw Linux disk I/O APIs with the aid of Direct I/O to bypass kernel cache management. Data checksum (e.g., an MD5 checksum) is often stored along with data's metadata in order to verify data correctness. Data checksum computation is CPU-intensive. To accelerate checksum computation, the accelerator component 131 leverages customized checksum algorithms that parallelize computation among data blocks. In addition, the accelerator component 131 offloads the checksum computation to an ARM co-processor called Cryptographic Engine and Security Accelerator (CESA). To overcome network bottlenecks, the accelerator component 131 may fine tune network packet size, buffer size, number of queues, transmission control protocol (TCP) slow start, TCP transfer window size, and exploit NIC features such as large segment offload and jumbo frame. To improve the I/O performance on small files, the small files are batched together to reduce the overhead of network connection creation, disk seeking and CPU interrupts. Other optimizations performed by the accelerator component 131 may include a memory/object pool, a thread pool, a network connection pool, a customized network protocol (e.g., a customized version of the user datagram protocol (UDP)) to reduce communication overhead, and on-the-fly data compression/decompression to reduce data size.

In one embodiment, the accelerator component 131 has the choice of using TCP or UDP as the transport layer. TCP has connection setup and teardown overhead and is the default option in high reliable networks with low loss rates. In a network with poor network conditions (e.g., a lossy network), the accelerator component 131 may use a reliable variant of UDP which keeps sequence numbers and retransmit packets if acknowledgements are not received after timeouts. The amount of data sent using UDP may adjusted adaptively based on how many packets are received successfully over a time window. The accelerator component 131 may also use erasure coding to transmit data. Each object or block is broken into smaller encoded blocks (e.g., codewords, symbols) and transmitted in UDP packets. Only a subset of the encoded blocks is needed to recover the original block.

At the storage middleware layer, the system may provide various types of data storage capabilities. For example, the microserver may provide object storage 141 (e.g., object-based storage). In another example, the microserver may provide block storage 142 (e.g., block level or block-based storage). In a further example, the microserver may provide file storage 143 (e.g., file-based storage). In another example, the microserver may provide database (DB) storage 144 (e.g., table based storage).

At the cloud layer, the system may include cloud-based infrastructure to manage a large number of microservers. The infrastructure consists of management 151 (e.g., management tools/modules), monitoring 152 (e.g., monitoring tools/modules), and usability 153 (e.g., usability tools/models). The management tools/modules automate cluster deployment, expansion, repairing, and upgrading. The monitoring tools/modules may be responsible for collecting, storing, visualizing data metrics of system status.

Figure 2:
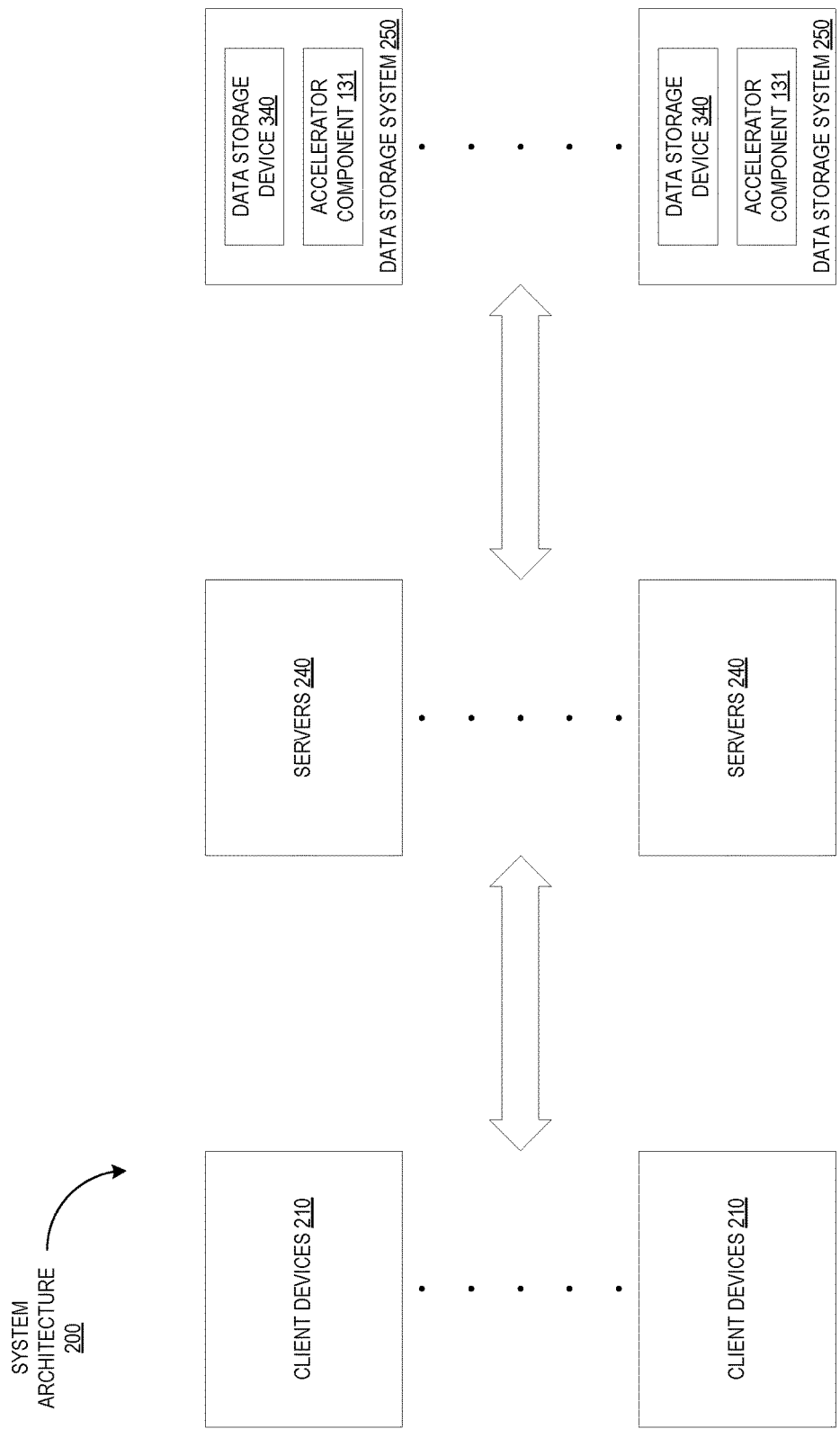
FIG. 2 is a block diagram that illustrates an example system architecture, in accordance with some embodiments of the present disclosure.

FIG. 2 is a block diagram that illustrates an example system architecture 200, in accordance with some embodiments of the present disclosure. The system architecture 200 includes data storage system 250, servers 240, and client devices 210. The data storage systems 250 may each include one or more processing devices (e.g., a primary processing device and/or one or more secondary processing devices), an accelerator component 131, and one or more data storage devices 340 (e.g., an HDD). The data storage systems may be deployed within private cloud (e.g., located on leased racks within a co-location facility or located on premise). The data storage systems may be ARM-based storage microservers. As discussed above, each data storage system 250 may use low-level hardware/software optimizations to speed up I/O performance on ARM hardware within the data storage system 250. The client devices 210 may access data stored on the data storage system 250 via application programming interfaces (APIs) of the storage middleware. For example, in an object store, the API may perform PUT/GET/DELETE of objects using HTTP messages. These requests are handled by servers 240, which may be referred to as access servers. The servers 240 may receive requests from the client devices 210 and may transform the requests into actual read/write operations/instructions on the data storage systems 250. The servers 240 may also forward data between the client device 210 and the data storage systems 250.

As discussed above, a cloud-based infrastructure may be used to automate storage cluster deployment, configuration, maintenance, and monitoring. The cloud-based management infrastructure automates all aspects of storage cluster management, including cluster expansion (add storage capability), repairing (replace failed hardware/software component), upgrade (change hardware/software component), and decommission (remove outdated hardware). As data storage systems 250 are added and removed, the management system may automatically deal with initialization, rebalancing, and re-distribution among all data storage systems 250. Moreover, the management system deploys a cloud orchestration infrastructure (e.g., OpenStack). The management system may also help ensure that the cluster can tolerate fault with high availability, so that any component failure will not bring down the system architecture 200.

Monitoring may be an important function in the system architecture 200. This allows the system architecture 200 (and/or users) to take timely actions whenever there are disk failures, chassis overheating, power outages, network disconnections, or storage capacity depletion in production environment. The system architecture may deploy scale-out and highly available monitoring system for the data storage systems 250. The monitoring system uses low-overhead status collecting software to extract data metrics from the data storage systems 250, and then store them in a data store with built-in data redundancy. Further, visualizations may be generated based on the collected data metrics. Alerting notifications for anomalies are sent out via phone call, email, or SMS, and/or other types of messages.

In one embodiment, the management system includes a caching tier to improve the performance of data read by prefetching them into a random access memory (RAM) array, a load balancing substrate for backend microservers to avoid any hot spots, and a web-based UI dashboard that displays current statuses, metrics, etc., in a single-panel mode for easy access.

The cloud-based infrastructure may enable users to manage and monitor the data storage systems 250 from a web interface. The cloud-based infrastructure may be located in-house within a user's servers. In one embodiment, the cloud-based infrastructure may be based on OpenStack. In other embodiments, the cloud-based infrastructure may operate with any cloud orchestration system. The cloud-based infrastructure may provide HTTP RESTful APIs for object PUT/GET/DELETE.

The accelerator component 131 may boost the I/O performance of the data storage systems 250. The accelerator component 131 may also boost the speed of data recovery if any data storage system 250 fails. The network communication protocol between servers 240 and data storage system 250 has been modified so that the I/O performance boost in the data storage systems 250 be leveraged by the servers 240 (e.g., the access servers). This may involve replacing current HTTP RESTful calls with the customized protocol used by the accelerator component 131. The architecture of the servers 240 may be based on consistent hashing of an object's keys. This enables the storage system architecture to scale linearly. By adding more data storage system 250, the system architecture's aggregate I/O performance grows linearly. The system architecture 200 can simultaneously provide diverse storage including object storage, block storage, and file storage, etc.

The data storage systems 250 may use error correction codes (e.g., erasure codes) to both transmit data and to store data within the data storage devices 240. For example, codewords may be spread across multiple data storage devices 304 and/or across data storage system 250. By using erasure coding, storage capacity requirement can be significantly reduced compared to using copies. In addition, erasure coding allows the client devices 210 to decode and/or reconstruct data even if some of the codewords are not received.

Figure 3:
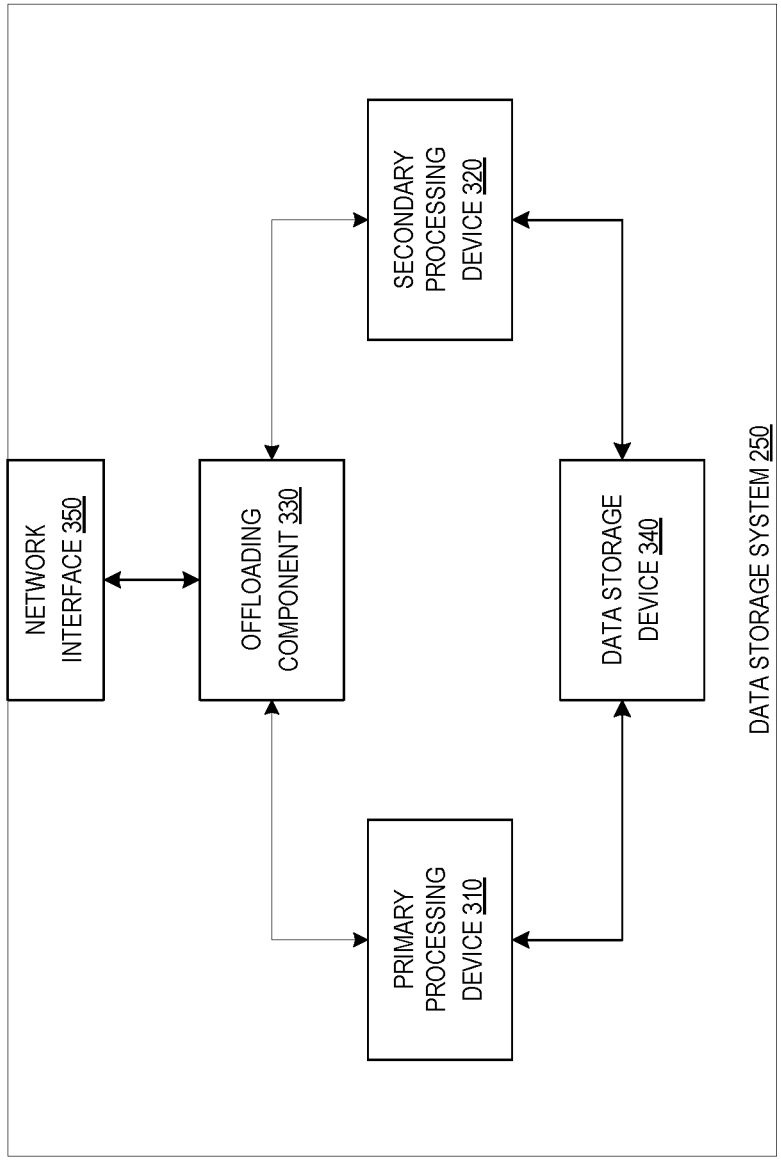
FIG. 3 is a block diagram of an example data storage system, in accordance with some embodiments of the present disclosure.

FIG. 3 is a block diagram of an example data storage system 250, in accordance with some embodiments of the present disclosure. In one embodiment, the data storage system 250 may be a server (e.g., a microserver, a storage server, etc.) that may provide storage capabilities for computing devices. The data storage system 250 includes a network interface 350, an offloading component 330, a primary processing device 310, a secondary processing device 320, and a data storage device 340. The network interface 350 may be one or more devices, components, modules, interfaces, ports, etc., that may receive data from or transmit data to one or more networks or devices. For example, the network interface 350 may be a network interface card (NIC), a wireless network card, an Ethernet port, etc. In one embodiment, a network interface 350 may be an ingress interface that receives data (e.g., messages, packets, frames, etc.). In another embodiment, a network interface 350 may be an egress interface that transmits data. In a further embodiment, a network interface 350 may be both an egress interface and an ingress interface. The network interface 350 may be coupled to a network. The network may be a public network (e.g., the Internet), a private network (e.g., a local area network (LAN) or wide area network (WAN)), or a combination thereof. In one embodiment, a network may include a wired or a wireless infrastructure, which may be provided by one or more wireless communications systems, such as a wireless fidelity (Wi-Fi) hotspot connected with the network and/or a wireless carrier system that can be implemented using various data processing equipment, communication towers (e.g. cell towers), etc. The network interface may also be referred to as a communication interface.

In one embodiment, the offloading component 330 may be hardware (e.g., a circuit, processing logic, a programmable logic device, a processing device, etc.), firmware, software, or a combination thereof that may provide data to one or more of the primary processing device 310 and the secondary processing device 320. The offloading component 330 may be part of an accelerator component (e.g., accelerator component 131) illustrated in FIGS. 1 and 2.

In one embodiment, the data storage device 340 may be a device, component, module, that is capable of storing data. For example, the data storage device 340 may allow data to be read from a memory of the data storage device 340 (e.g., one or more magnetic disks, one or more pages, blocks, sectors, tracks, etc.), may allow data to be written to the memory, and/or may allow data to be modified. In some embodiments, the data storage device 340 may be a hard disk drive (HDD). For example, the data storage device 340 may be a magnetic disk drive. Using a magnetic disk drive may reduce the costs to manufacture and/or operate the data storage system 250. For example, a magnetic disk drive may not deteriorate, degrade, break, etc., as quickly as other types of drives (e.g., a solid state drive (SSD)). In other embodiments, the data storage device 340 may be a SSD or some other type of storage device that uses flash memory.

In one embodiment, the primary processing device 310 may be a general purpose processing device. A general purpose processing device may be a processing device that is configured to perform general operations, rather than specific type of operations. For example, an x86 processor, an advanced reduced instruction set computing (RISC) machine (ARM) processor, etc., may be examples of general purpose processors.

In one embodiment, the secondary processing device 320 may be a device that may be configured to perform various other operations to supplement the primary processing device 310. For example, the secondary processing device 320 may be a cryptographic engine that is configured to perform cryptographic operations (e.g., encryption and/or decryption operations) on data (e.g., encrypt data and/or decrypt data). One example of a cryptographic engine may be a cryptographic engine and security accelerator (CESA). Because the secondary processing device 320 may be capable of performing cryptographic operations, this may allow the secondary processing device 320 to be used and/or adapted for generating checksums more easily. In other embodiments, the secondary processing device 320 may perform various other tasks, operations, instructions, etc. For example, the secondary processing device 320 may perform floating point operations, vector operations, matrix operations, tensor operations, graphic operations, etc., to supplement the primary processing device 310.

In one embodiment, the primary processing device 310 may be an advanced reduced instruction set computing (RISC) machine (ARM) processor. The ARM processor may be a lower power general purpose processor when compared to other general purpose processors, such as x86 processors. The secondary processing device 320 may be an ARM coprocessor. By using ARM processors and/or ARM coprocessors, the data storage system 250 may use less power and/or operate more efficiently than if x86 processors were used in the data storage system 250.

In one embodiment, one or more of the primary processing device 310 and secondary processing device 320 may be part of a system on a chip (SoC). A SoC may be a device (e.g., hardware, circuits, etc.) that integrate some or all of the components of a computing device on a single substrate or chip (e.g., single microchip). For example, the processing device, primary memory (e.g., random access memory), input/output ports (e.g., bus ports), etc., may be integrated onto a single substrate, single die, single chip, etc. The SoC may improve the performance of the data storage system 250 and/or reduce the power consumption of the data storage system 250. The SoC may also allow for a reduction in the size of the data storage system 250 when compared to traditional systems which may use an x86 processor, a motherboard, and various peripheral devices.

In one embodiment, the offloading component 330 may receive data (e.g., a set of data) via the network interface 350 (e.g., a communication interface). For example, the network interface 350 may receive a set of data transmitted by another computing device. The network interface 350 and the computing device may be communicatively coupled via one or more networks. The network interface 350 may provide the data to the offloading component 330. In other embodiments, the network interface 350 may provide the data (received from the computing device) directly to one or more of the primary processing device 310 and the secondary processing device 320.

As discussed above, a checksum (e.g., checksum data, parity bits, parity data, etc.) may be used to detect errors in data that is stored on the data storage system 250 (e.g., on the data storage device 340). For example, if the data storage devices 340 has an issue, error, malfunctions, problem, etc., some of the data stored in the data storage device 340 may have errors, may become corrupted, etc. A checksum for a piece of data may allow a computing device and/or a processing device to determine whether there are any errors in the data.

In one embodiment, the offloading component 330 may determine whether the primary processing device 310 should be used for performing checksum computations for the data that is received via the network interface 350 (e.g., whether the primary processing device 310 should be used to calculate, computer, determine, generate, etc., a checksum). For example, the data storage system 250 may receive data from computing devices that want to store their data on the data storage system 250. For example, the offloading component 330 may analyze various factors, parameters, criteria, thresholds, etc., to determine whether the primary processing device 310 should generate the checksum for a set of data (e.g., one or more blocks, pages, etc., of data). The various factors, parameters, criteria, thresholds, etc., for determining whether the primary processing device 310 should generate the checksum for the set of data are discussed in more detail below.

In one embodiment, the offloading component 330 may provide the first set of data to the primary processing device 310 in response to determining that the primary processing device 310 should be used for performing checksum computations for the first set of data. For example, based on various factors, parameters, criteria, thresholds, etc., the offloading component 330 may forward the data (that was received from the computing device via the network interface 350) to the primary processing device 310 so that the primary processing device 310 can generate a checksum for the data. In another embodiment, the offloading component 330 may instruct and/or cause the network interface 350 to forward the data to the primary processing device 310. For example, the network interface 350 may directly forward the data directly to the primary processing device 310.

In one embodiment, the offloading component 330 may provide the first set of data to the secondary processing device 320 in response to determining that the primary processing device 310 should not be used for performing checksum computations for the first set of data. For example, based on various factors, parameters, criteria, thresholds, etc., the offloading component 330 may forward the data (that was received from the computing device via the network interface 350) to the secondary processing device 320 so that the secondary processing device 320 can generate a checksum for the data. In another embodiment, the offloading component 330 may instruct and/or cause the network interface 350 to forward the data to the secondary processing device 320. For example, the network interface 350 may directly forward the data directly to the secondary processing device 320.

In one embodiment, the offloading component 330 may a first portion of the data (received from the computing device) to the primary processing device 310 and a second portion of the data to the secondary processing device 320. For example, based on various factors, parameters, criteria, thresholds, etc., the offloading component 330 may determine that the primary processing device 310 should generate a first set of checksums for the first portion of the data and that the secondary processing device 320 should generate a second set of checksums for the second portion of the data. This may spread the work and/or load of generating checksums across the primary processing device 310 and the secondary processing device 320, which may allow the checksums to be generated more quickly, efficiently, etc. In another embodiment, the offloading component 330 may instruct and/or cause the network interface 350 to forward the first portion of the data to the primary processing device 310 and the second portion of the data to the secondary processing device 320. For example, the network interface 350 may directly forward the first portion of the data to the primary processing device 310 and may directly forward the second portion of the data to the secondary processing device 320.

In one embodiment, one of the factors, parameters, criteria, thresholds that the offloading component 330 may analyze may be the number of checksums generated by the primary processing device 310 over a period of time. The offloading component 330 may determine, analyze, calculate, etc., the number of checksums that the primary processing device 310 generated (e.g., calculated, determined, etc.) over a period of time. For example, the offloading component 330 may determine the number of checksums (e.g., the amount of checksum data) that the primary processing device 310 has generated in the last second, last 5 seconds, or some other appropriated period of time. If the number of checksums generated by the primary processing device 310 over a period of time is below a threshold number (e.g., is below a threshold number of checksums), the offloading component 330 may determine that the secondary processing device 320 should generate the checksums for the received data. For example, if the number of checksums generated by the primary processing device 310 over a period of time is below a threshold number, this may indicate that the primary processing device 310 is busy performing other operations and/or functions, and may not be able to generate checksums for the receive data quickly and/or efficiently.

In one embodiment, one of the factors, parameters, criteria, thresholds that the offloading component 330 may analyze may be a current load of the primary processing device 310. The offloading component 330 may determine, analyze, calculate, etc., the number of instructions, operations, etc., that the primary processing device 310 is currently executing and/or are pending execution. For example, the offloading component 330 may analyze an instruction queue to determine the number of instructions and/or operations that are pending execution by the primary processing device 310. If the number of instructions and/or operations in the instruction queue is above a threshold number (e.g., is below a threshold number of instructions), the offloading component 330 may determine that the secondary processing device 320 should generate the checksums for the received data. For example, if the number of instructions and/or operations in the instruction queue is above a threshold number, this may indicate that the primary processing device 310 is busy and/or will be busy performing other operations and/or functions, and may not be able to generate checksums for the receive data quickly and/or efficiently.

In one embodiment, one of the factors, parameters, criteria, thresholds that the offloading component 330 may analyze may be a current data rate of data that is received via the network interface 350. The offloading component 330 may determine a current data rate of data received via the network interface 350. For example, the offloading component 330 may determine the amount of data that has been received from other computing devices via the network interface 350 over a period of time. Based on the current data rate, the offloading component 330 may determine whether the data should be provided to primary processing device 310 or the secondary processing device 320. For example, if the data rate is above a threshold data rate, the offloading component 330 may determine that the primary processing device 310 is unable to generate checksums for the data and may provide the data to the secondary processing device 320. If the data rate is below a threshold, the offloading component 330 may determine that the primary processing device 310 is capable of generating the checksums and may provide the data to the primary processing device 310.

In one embodiment, one of the factors, parameters, criteria, thresholds that the offloading component 330 may analyze may be the current time. For example, the offloading component 330 may determine a current time. The offloading component 330 may determine that different amounts of data are received by the data storage system 250 at different times of the day. Based on the current time (e.g., time of day), the processing device may determine whether the primary processing device should be used for performing checksum computations. For example, at the times of the day where a higher amount of data is expected, the offloading component 330 may forward some or all of the data to the secondary processing device 320 to generate checksums.

In one embodiment, the primary processing device 310 and/or the offloading component 330 may store the data (that was received from a computing device via the network interface 350) in the data storage device 340. For example, the primary processing device 310 and/or the offloading component 330 may write the data to the data storage device 340 (e.g., a hard disk drive (HDD), a magnetic disk drive, etc.). The primary processing device 310 and/or the offloading component 330 may also store the checksum for the data in the data storage device 340.

In one embodiment, the data storage device (e.g., primary processing device 310 and/or the offloading component 330) may receive a request to access a first set of data. For example, the same computing device and/or another computing device may transmit a request to access the data to the data storage system 250. The request may be received via the network interface 350 and may be provided to the primary processing device 310 and/or the offloading component 330. The primary processing device 310 and/or the offloading component 330 may access and/or retrieve the first set of data and a first checksum (for the first set of data) from the data storage device. For example, the primary processing device 310 and/or the offloading component 330 may read the first set of data and the checksum from the data storage device 340. The primary processing device 310 and/or the offloading component 330 may verify the first set of data using the first checksum. For example, the primary processing device 310 and/or the offloading component 330 may perform one or more operations using the first checksum to determine whether there are any errors in the first set of data. If there are no errors, the primary processing device 310 and/or the offloading component 330 may transmit the first set of data to the computing device via the network interface 350.

In one embodiment, the data storage system 250 may be a computing device. A computing device may be a device that may include hardware such as processing devices (e.g., processors, central processing units (CPUs), processing cores, memory (e.g., random access memory (RAM), data storage devices (e.g., hard-disk drive (HDD), solid-state drive (SSD), etc.), and/or other hardware devices (e.g., sound card, video card, etc.). A computing device may include any suitable type of device or machine that has a programmable processor including, for example, server computers, desktop computers, laptop computers, tablet computers, smartphones, set-top boxes, etc. In some examples, a computing device may include a single machine or may include multiple interconnected machines (e.g., multiple servers configured in a cluster). Each computing device may execute or include an operating system (OS), as discussed in more detail below. The OS of a computing device may manage the execution of other components (e.g., software, applications, etc.) and/or may manage access to the hardware (e.g., processors, memory, storage devices etc.) of the computing device.

The data storage system 250 may also include a virtual machine (VM). A VM may be a software implementation of a machine (e.g., a software implementation of a computing device) that includes its own operating system (referred to as a guest OS) and executes application programs, applications, software. A VM may execute on a hypervisor which executes on top of the OS for a computing device (referred to as a host OS). The hypervisor may also be referred to as a virtual machine monitor (VMM). The hypervisor may be a component of an OS for a computing device, may run on top of the OS for a computing device, or may run directly on host hardware without the use of an OS. The hypervisor may manage system resources, including access to hardware devices such as physical processing devices (e.g., processors, CPUs, etc.), physical memory (e.g., RAM), data storage device (e.g., HDDs, SSDs), and/or other devices (e.g., sound cards, video cards, etc.). The hypervisor may also emulate the hardware (or other physical resources) which may be used by the VMs to execute software/applications. The hypervisor may also present other software (e.g., "guest" software) the abstraction of one or more virtual machines (VMs). A VM may execute guest software that uses an underlying emulation of the physical resources (e.g., virtual processors and guest memory).

The data storage system 250 may also include a container. A container may be an isolated set of resources allocated to executing an application, software, and/or process independent from other applications, software, and/or processes. A container may execute on a container engine which executes on top of the OS for a computing device. The host OS (e.g., an OS of the computing device) may use namespaces to isolate the resources of the containers from each other. A container may also be a virtualized object similar to virtual machines. However, a container may not implement separate guest OS (like a VM). The container may share the kernel, libraries, and binaries of the host OS with other containers that are executing on the computing device. The container engine may allow different containers to share the host OS (e.g., the OS kernel, binaries, libraries, etc.) of a computing device. For example, the container engine may multiplex the binaries and/or libraries of the host OS between multiple containers. The container engine may also facilitate interactions between the container and the resources of the computing device. For example, the container engine may manage requests from container to access a memory (e.g., a RAM) of the computing device. In another example, the container engine may manage requests from the container to access certain libraries/binaries of the host OS. The container engine may also be used to create, remove, and manage containers. In one embodiment, the container engine may be a component of a host operating system. In another embodiment, container engine may run on top of a host operating system, or may run directly on host hardware without the use of a host operating system.

In one embodiment, the offloading component 330 may perform load balancing functions for data storage system 250. For example, the packet forwarding component 120 may balance the amount of data that is forwarded to the primary processing device 310 and the secondary processing device 320 for generating checksums. This may help prevent primary processing device 310 and/or the secondary processing device 320 from being overloaded. This may also allow the data storage system 250 to operate more efficiently (e.g., to generate checksums more efficiently).

In one embodiment, the data storage system 250 may be located in one or more data centers or cloud computing architectures (e.g., clouds) that includes multiple computing devices, such as server computers. For example, the data storage system 250 may be located in one or more server/device racks of a data center, along with multiple other data storage systems. As discussed above, the data storage system 250 may be microserver (e.g., a smaller form factor device) such that multiple data storage system may be able to fit within a single rack space of a rack in the data center.

Figure 4:
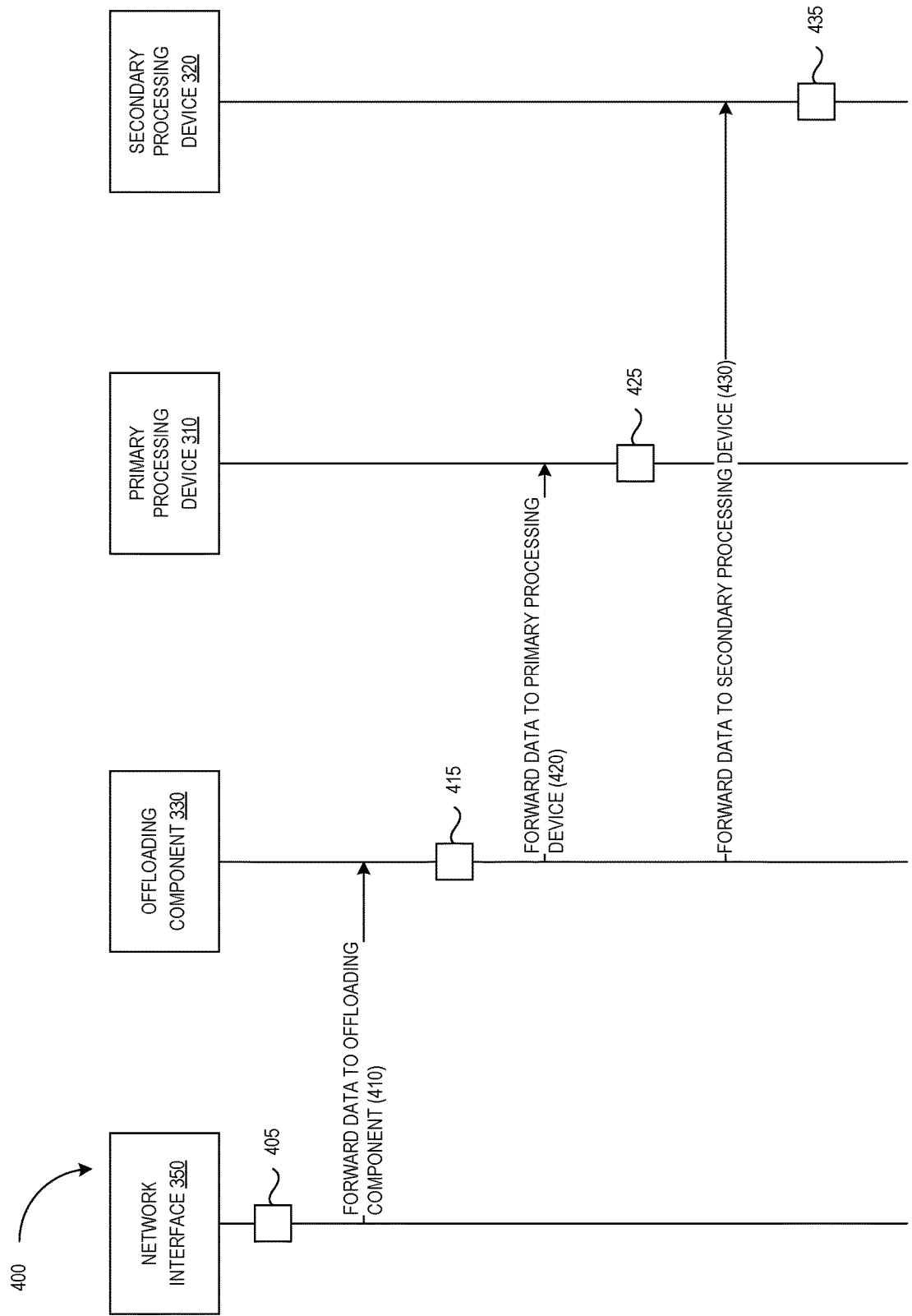
FIG. 4 is a diagram of an example sequence diagram, in accordance with some embodiments of the present disclosure.

FIG. 4 is a diagram of an example sequence diagram 400, in accordance with some embodiments of the present disclosure. The sequence diagram 400 may illustrate operations, functions, actions, etc., performed by different components of a data storage system (e.g., data storage system 250 illustrated in FIG. 3). For example, the operations of the network interface 350, offloading component 330, primary processing device 310, and secondary processing device 320 are illustrated in sequence diagram 400.

At block 405, the network interface 350 may receive data from a computing device to be stored in a data storage device (e.g., a HDD) of the data storage system. The network interface 350 may forward the data to the offloading component 410. In other embodiments, the network interface 350 may forward the data (or portions of the data) directly to one or more of the primary processing device 310 and the secondary processing device 320, rather than to the offloading component 330, as discussed above. At block 415, the offloading component 330 may analyze various factors, parameters, criteria, thresholds, etc., to determine whether the data (or portions of the data) should be forwarded to the primary processing device 310 and/or the secondary processing device 320. For example, the offloading component 330 may analyze the current load on the primary processing device 310, the number of checksums generated by the primary processing device 310, etc.

At block 420, the offloading component 330 may forward the data to the primary processing device 310 or may instruct/cause the network interface 350 to forward the data to the primary processing device 310. At block 425, the primary processing device 310 may generate a checksum for the data. At block 430, the offloading component 330 may forward the data to the secondary processing device 320 or may instruct/cause the network interface 350 to forward the data to the secondary processing device 320. At block 435, the secondary processing device 320 may generate a checksum for the data. As discussed above, in different embodiments, the offloading component 330 may forward the data or portions of the data to one or more of the primary processing device 310 and the secondary processing device 320. Thus, any combination of blocks 420, 425, 430, and 435 may be performed by the offloading component 330, the primary processing device 310, and the secondary processing device 320.

Figure 5:
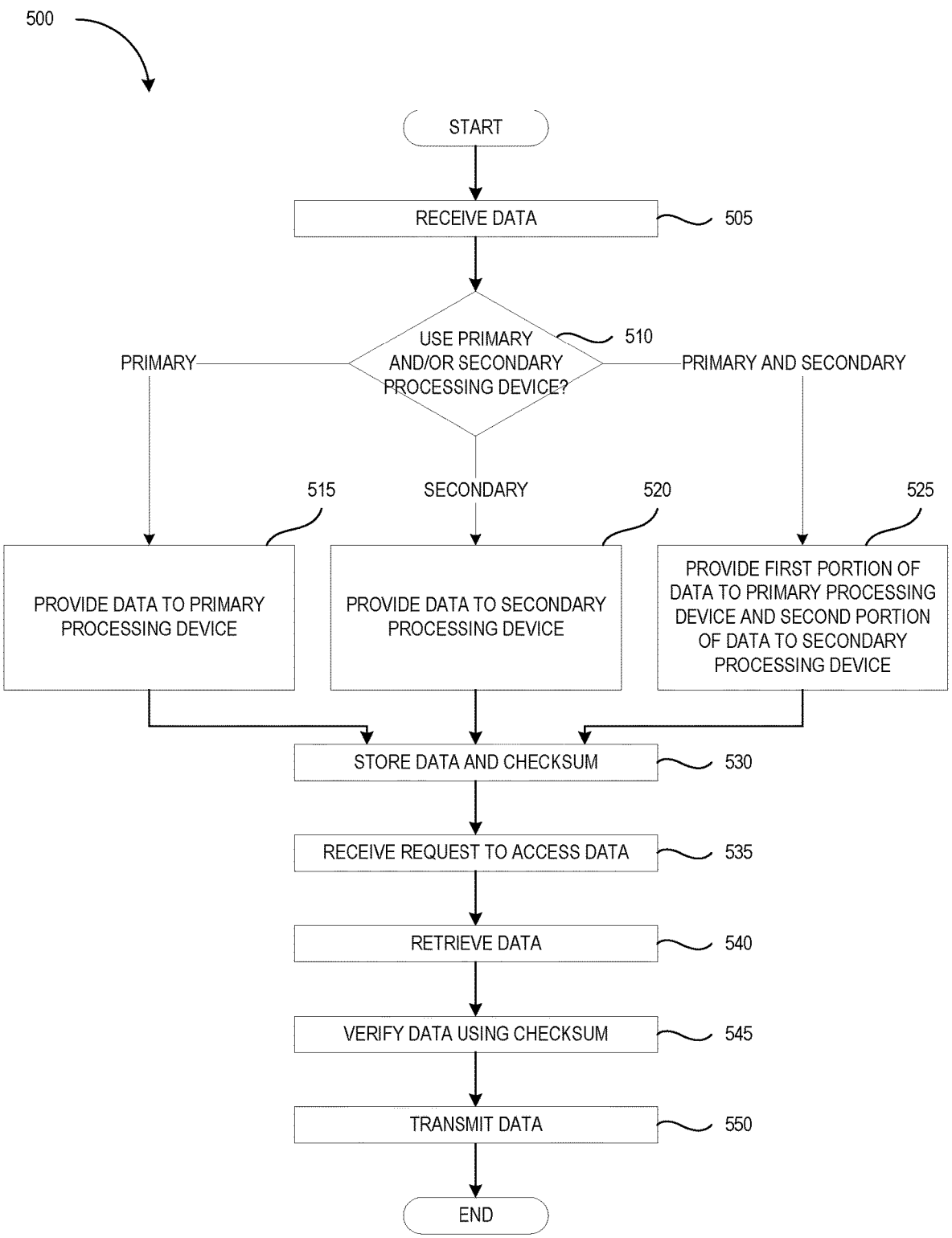
FIG. 5 is a flow diagram of a process for offloading operations, in accordance with some embodiments of the present disclosure.

FIG. 5 is a flow diagram of a process 500 of storing data in a data storage system, in accordance with some embodiments. Process 500 may be performed by processing logic that may comprise hardware (e.g., circuitry, dedicated logic, programmable logic, a processor, a processing device, a central processing unit (CPU), a system-on-chip (SoC), etc.), software (e.g., instructions running/executing on a processing device), firmware (e.g., microcode), or a combination thereof. In some embodiments, the process 500 may be performed by one or more of a data storage system, an accelerator component, an offloading component, and/or a computing device.

The process 500 begins at block 505, where the process 500 may receive data from a computing device. The data may be received via a network interface of a data storage system. At block 510, the process 500 may determine whether one or more of the primary processing device and secondary processing device should be used to generate one or more checksums for the data. For example, the process 500 may analyze the current load of the primary processing device, may analyze the number of checksums generated by the primary processing device over a period of time, etc. If the primary processing device should be used, the process 500 may provide the data to the primary processing device at block 515, wherein the primary processing device may generate the checksum. If the secondary processing device should be used, the process 500 may provide the data to the secondary processing device at block 520, wherein the secondary processing device may generate the checksum. If both the primary processing device and the secondary processing device should be used, the process 500 may provide a first portion of the data to the primary processing device and a second portion of the data to the secondary processing device. The primary processing device may generate a first checksum for the first portion and the secondary processing device may generate a checksum for the second portion.

At block 530, the process 500 may store the data and the checksum to a data storage device (e.g., a HDD). For example, the process 500 may write the data and the checksum to the data storage device. At block 535, the process 500 may receive a request to access the data from a computing device. The process 500 may retrieve the data (e.g., read the data) from the data storage device at block 540. The process 500 may also retrieve the checksum from the data storage device. At block 545, the process 500 may verify the data using the checksum. For example, the process 500 may perform one or more operations (e.g., an exclusive OR (XOR) operation) on the data and the checksum to determine whether there are errors in the data. At block 550, the process 500 may transmit the data to the computing device if there are no errors in the data (e.g., if the data is verified).

Figure 6:
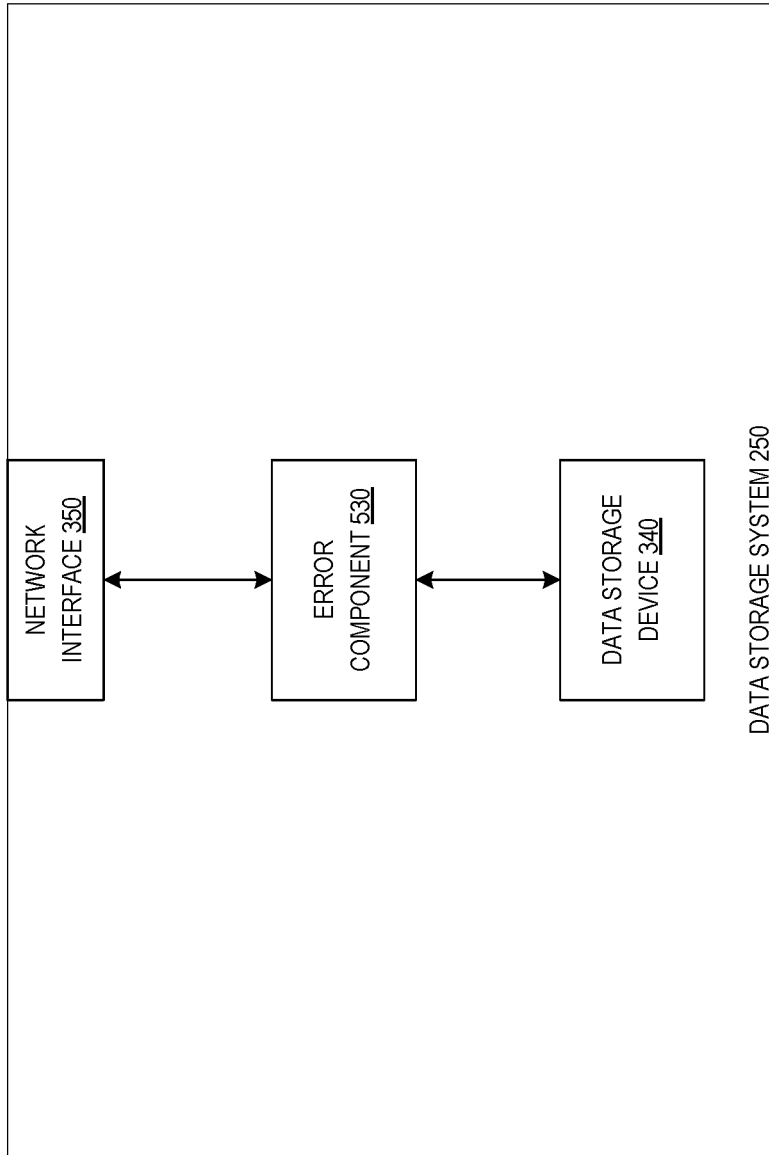
FIG. 6 is a block diagram of an example data storage system, in accordance with some embodiments of the present disclosure.

FIG. 6 is a block diagram of an example data storage system 250, in accordance with some embodiments of the present disclosure. In one embodiment, the data storage system 250 may be a server (e.g., a microserver, a storage server, etc.) that may provide storage capabilities for computing devices. The data storage system 250 includes a network interface 350, an error component 630, and a data storage device 340. The network interface 350 may be one or more devices, components, modules, interfaces, ports, etc., that may receive data from or transmit data to one or more networks or devices. The network interface 350 may be coupled to one or more networks. The one or more networks may carry communications (e.g., messages, packets, frames, etc.) between the data storage system 250 and other devices (e.g., other computing devices). The one or more networks may include a combination of public networks, private networks, wide area networks, metropolitan area networks, wired networks, wireless, networks, etc.

In one embodiment, the error component 630 may be hardware (e.g., a circuit, processing logic, a programmable logic device, a processing device, etc.), firmware, software, or a combination thereof that may generate one or more codewords (e.g., symbols) for data. The error component 630 may be part of an accelerator component (e.g., accelerator component 131) illustrated in FIGS. 1 and 2. In one embodiment, the data storage device 340 may be a device, component, module, that is capable of storing data. For example, the data storage device 340 may be a hard disk drive (HDD).

In one embodiment, the network interface 350 may receive a request for a first set of data stored on the data storage system 250 (e.g., stored in the data storage device 340). For example, the network interface 350 may receive a request (e.g., a message) from a computing device to access the first set of data. The network interface 350 may forward the request to the error component 630. The error component 630 may retrieve the first set of data from the data storage device 340. For example, the error component 630 may read the first set of data from the data storage device 340. The error component 630 may also read the checksum for the first set of data and verify the first set of data based on the checksum (e.g., determine whether there are errors in the first set of data).

In one embodiment, the error component 630 may generate a set of codewords based on the first set of data and an error correction code. For example, the error correction code may include and/or be associated with coding function that may be used to encode data to generate the set of codewords. The set of codewords may also be referred to as symbols. Encoding the first set of data into the set of codewords may allow the first set of data to be recovered and/or decoded even if one or more of the set of codewords is lost, as discussed in more detail below.

In one embodiment, the error component 630 may transmit the set of codewords to the computing device that requested the first set of data via a set of network packets (e.g., a set of messages, packets, frames, etc.). For example, each network packet that is transmitted to the computing device may include a codeword from the set of codewords (that was generated using the error correction code).

As discussed above, the first set of data may still be decoded and/or recovered if one or more of the set of codewords is not received by the computing device. For example, one or more of the network packets (that is transmitted by the data storage system 250) may not be received by the computing device. The computing device may not receive one or more of the network packets due to various network conditions (e.g., due to a bad link, due to lag, etc.). The set of codewords may include parity data that is generated by the coding function of the error correction code. The parity data may be distributed throughout the set of codewords along with the first set of data. The parity data that is distributed throughout the set of codewords allows the computing device to decode and/or recover the first set of data using a subset of the set of codewords.

In one embodiment, the error correction code may be an erasure code. An erasure code may be a type of error correction code that may transform, encode, etc., a set of data into one or more codewords (e.g., symbols). The set of codewords may have a total size that is larger than the set of data. The larger size maybe due to the parity bits that are included in each of the codewords, which allow for decoding and/or recovery of the set of data using a subset of the set of codewords. For example, the set of data may have a size k. The set of codewords may have a size (e.g., a total size) of n. Thus, the erasure code may have coding rate of k/n, where k is the number bits and/or size of the original data and n is the number of bits and/or size of the encoded codewords/symbols. Different erasure codes may allow for a different number of codewords to be lost while still allowing the set of data to be recovered and/or decoded. For example, an erasure code may generate four codewords for a set of data and may allow the set of data to be decoded/recovered if at least three codewords are received. In another example, an erasure code may generate eight codewords for a set of data and may allow the set of data to be decoded/recovered if at least five codewords are received. The minimum number of codewords to decode/recover a set of data may be based on the coding function and/or the type of erasure code used.

In one embodiment, the error component 630 may generate the set of codewords for a set of data by dividing the data into multiple portions. The multiple portions may be of equal size. A coding function of an error correction code and/or erasure code may be applied to the multiple portions. To generate the set of codewords. The number of codewords in the set of code words may be greater than or equal to the number of portions. For example, the set of data may be divided into two portions and four codewords may be generated based on the two portions. The coding function may include equations, actions, operations, functions, that may be applied to the multiple portions to generate the codewords. For example, the coding function may include an OR operation, an exclusive OR (XOR) operation, etc.

As discussed above, an error correction code, such as an erasure code, may use a coding function to generate one or more codewords. The minimum number of codewords to decode/recover a set of data may be based on the coding function and/or the type of erasure code used. The error component 630 may provide an indication of the erasure code and/or the coding function to the computing device. For example, the error component 630 may transmit a string, identifier, or some other value to the computing device to indicate the coding function and/or the type of erasure code used to generate the codewords. This may allow the computing device to properly decode and/or recover the set of data because the computing device can apply the proper coding function to the codewords to decoded and/or recover the set of data from the codewords.

In one embodiment, the set of network packets may be transmitted to the computing device using a network protocol that is unable to provide guaranteed (e.g., reliable) delivery of the set of network packets. For example, the error component 630 may use the user datagram protocol (UDP) protocol to transmit a set of UDP packets to the computing device. Each UDP packet may include one codeword. In other embodiments, the network protocol used by the data storage system 250 may be unable to provide one or more of the following features: reliable/guaranteed delivery of packets, ordered deliver of packets, congestion control, etc. Because the network protocol may not be able to provide guaranteed delivery of packets, encoding the data with an error correction code to generate codewords may allow the computing device to recover and/or decode data when some of the packets are not received.

As discussed above, the data storage system 250 may be a computing device. A computing device may be a device that may include hardware such as processing devices (e.g., processors, memory (e.g., RAM), storage devices (e.g., HDDs, SSDs), and other hardware devices (e.g., a video card), as discussed above. A computing device may include any suitable type of device or machine that has a programmable processor. The data storage system 250 may also include a VM. A VM may be a software implementation of a computing device) that includes its own operating system (referred to as a guest OS) and executes application programs, applications, software. A VM may execute on a hypervisor which may manage system resources, including access to hardware devices (e.g., a physical processor, a physical memory or storage device, etc.). The hypervisor may also emulate the physical resources or hardware which may be used by the VMs to execute software/applications. The data storage system may also include a container. A container may be an isolated set of resources allocated to executing an application, software, and/or process independent from other applications, software, and/or processes, as discussed above. A container may execute on a container engine which executes on top of the OS for a computing device which may allow different containers to share the host OS (e.g., the OS kernel, binaries, libraries, etc.) of a computing device.

Figure 7:
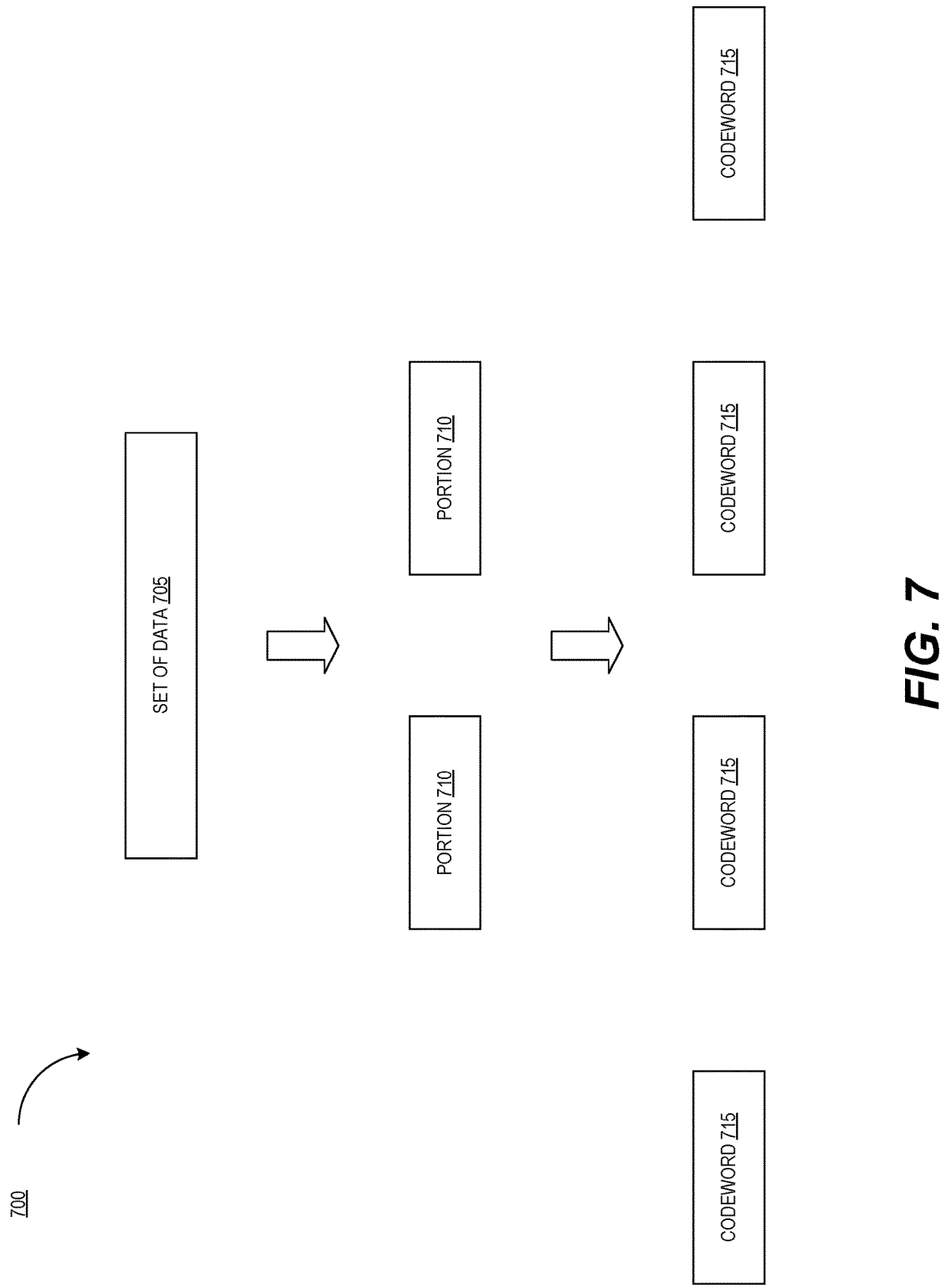
FIG. 7 is a block diagram illustrating an example process for generating codewords, in accordance with some embodiments of the present disclosure.

FIG. 7 is a block diagram illustrating an example process 700 for generating codewords, in accordance with some embodiments of the present disclosure. As discussed above, a computing device may request a set of data 705 from a data storage system. The data storage system may retrieve the set of data 705 and a checksum for the set of data. The data storage system may verify the set of data based on the checksum. To transmit the set of data 705 to the computing device, the data storage system may generate a set of codewords based on process 700.

The data storage system may take the set of data 705 and may divide the set of data 705 into two portions 710. The portions 710 may be of equal size. For example, each portion 710 may behalf of the size of the set of data 705. Although two portions 710 are illustrated in FIG. 7 the set of data 705 may be divided into another number of portions. The portions may be of equal size or may have different sizes. A coding function may be applied to the portions 710 to generate the codewords 715. For example, the portions 710 may be XORed together to generate some of the codewords 715. Each of the codewords 715 may be included as the payload of a network packet (e.g., as the payload of a UDP packet) and transmitted to the computing device that requested the set of data 705. As discussed above, the computing device may be able to recover and/or decode the set of data 705 using a subset of the codewords 715 (e.g., using less than four codewords 715).

Figure 8:
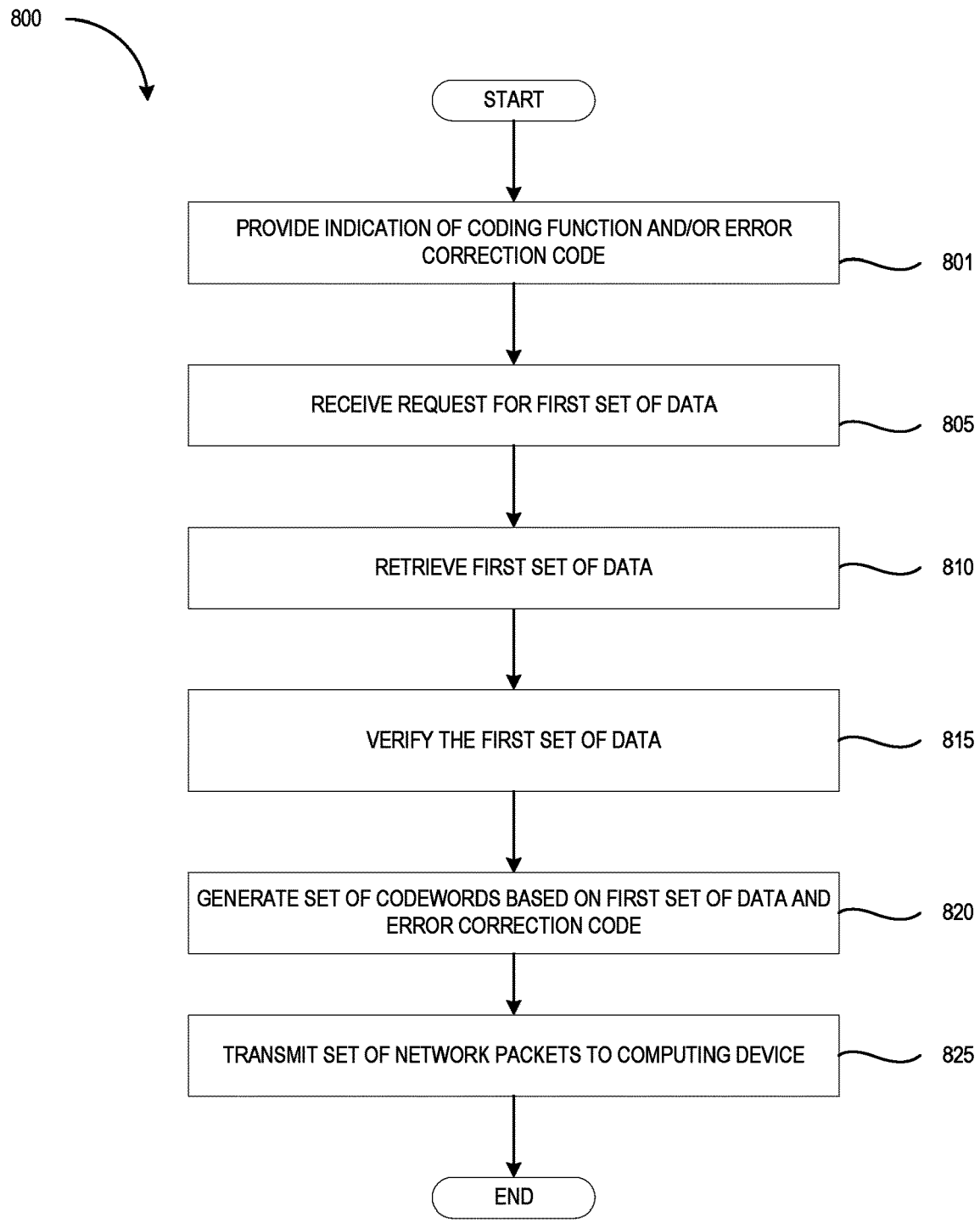
FIG. 8 is a flow diagram of a process for transmitting data, in accordance with some embodiments of the present disclosure.

FIG. 8 is a flow diagram of a process for transmitting data, in accordance with some embodiments of the present disclosure. Process 800 may be performed by processing logic that may comprise hardware (e.g., circuitry, dedicated logic, programmable logic, a processor, a processing device, a central processing unit (CPU), a system-on-chip (SoC), etc.), software (e.g., instructions running/executing on a processing device), firmware (e.g., microcode), or a combination thereof. In some embodiments, the process 800 may be performed by one or more of a data storage system, an accelerator component, an error component, and/or a computing device.

The process 800 begins at block 801 where the process 800 may optionally provide an indication of an error correction code and/or a coding function of the error correction code to a computing device. At block 805 the process 500 may receive a request for a first set of data from the computing device. For example, the computing device may transmit a message indicating that the computing device would like to access the first set of data. At block 810, the process 800 may retrieve the first set of data from a data storage device (e.g., an HDD). The process 800 may also retrieve the checksum from the first set of data from the data storage device. At block 815 the process 800 may verify the first set of data based on the checksum. For example, the process 800 may determine whether the first set of data has any errors based on the checksum.

At block 820, the process 800 may generate a set of codewords based on the set of data and an error correction code (e.g., an erasure code). For example, the process 800 may divide the set of data into multiple portions and may apply a coding function to the multiple portions to generate the set of codewords. The process 800 may transmit a set of network packets to the computing device and each of the network packets may include one codeword from the set of codewords.

Figure 9:
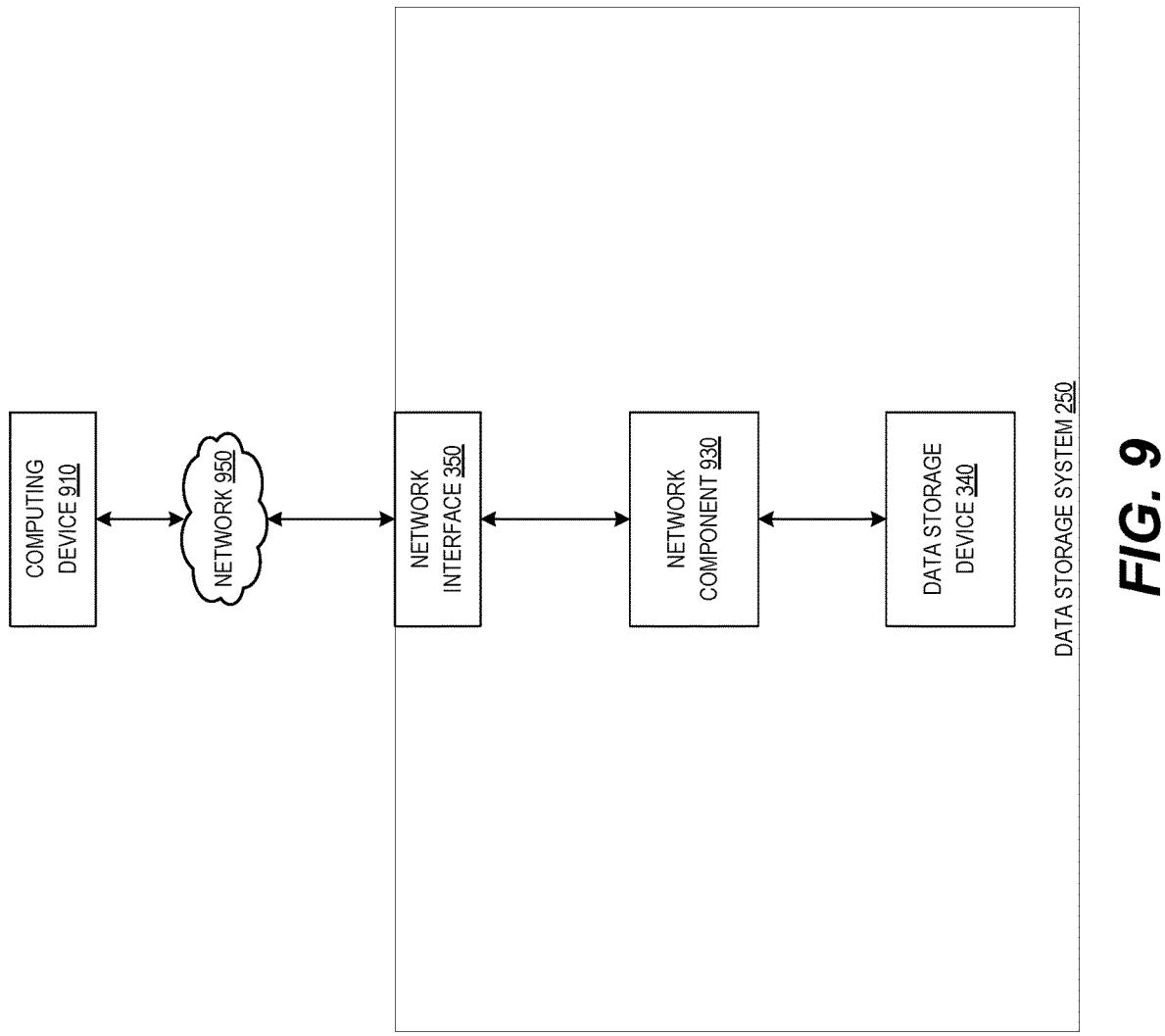
FIG. 9 is a block diagram of an example data storage system, in accordance with some embodiments of the present disclosure.

FIG. 9 is a block diagram of an example data storage system 250, in accordance with some embodiments of the present disclosure. In one embodiment, the data storage system 250 may be a server (e.g., a microserver, a storage server, etc.) that may provide storage capabilities for computing devices (e.g., may store data for computing devices). The data storage system 250 includes a network interface 350, a network component 930, and a data storage device 340. The network interface 350 may be one or more devices, components, modules, interfaces, ports, etc., that may receive data from or transmit data to one or more networks or devices. The network interface 350 may be coupled to network 950. The network 950 may carry communications (e.g., messages, packets, frames, etc.) between the data storage system 250 and the computing device 910. The network 950 may include a combination of public networks, private networks, wide area networks, metropolitan area networks, wired networks, wireless, networks, etc.

In one embodiment, the network component 930 may be hardware (e.g., a circuit, processing logic, a programmable logic device, a processing device, etc.), firmware, software, or a combination thereof that may change the network protocol used by the data storage system 250. The network component 930 may be part of an accelerator component (e.g., accelerator component 131) illustrated in FIGS. 1 and 2. In one embodiment, the data storage device 340 may be a device, component, module, that is capable of storing data. For example, the data storage device 340 may be a hard disk drive (HDD).

In one embodiment, the network component 930 may transmit a first set of data from the data storage system to the computing device 910 using a first network protocol. For example, the network component 930 may transmit the first set of data (e.g., a first set of network packets) to the computing device 910 using the transmission control protocol (TCP). In another example, the network component 930 may transmit the first set of data using UDP.

In one embodiment, the network component 930 may analyze one or more network conditions of the network 950 used by the computing device 910 and the data storage system 250. For example, the network component 930 may analyze a retransmission rate for network packets transmitted by the data storage system 250. The retransmission rate may indicate a number and/or a percentage of packets that are retransmitted because the packets were not received by the computing device 910. The retransmission rate may also be referred to as a loss rate, a packet loss rate, etc. In another example, the network component 930 may analyze the transmission delay for transmitting packets. The transmission delay may indicate the amount of time (e.g., in milliseconds, in seconds, etc.) for a packet to arrive at the computing device 910. The transmission delay may also be referred to as latency, lag, etc. In a further example, the network component 930 may analyze the throughout or bandwidth of the network. For example, the network component 930 may analyze the amount of data that was transmitted to the computing device 910 over a period of time. The retransmission rate, transmission delay, bandwidth/throughput are examples of network metrics. In other embodiments, other types of network metrics may be used and/or analyzed by the network component 930.

In one embodiment, the network component 930 may determine whether a second network protocol should be used to transmit a second set of data to the computing device 910, based on the one or more network metrics. For example, if the retransmission rate is higher than a threshold rate, the network component 930 may determine that a second network protocol should be used to transmit the second set of data to the computing device 910. In another example, if the bandwidth/throughput of the data is below a threshold, the network component 930 may determine that a second network protocol should be used to transmit the second set of data to the computing device 910. In a further example, if the transmission delay is above a threshold, the network component 930 may determine that a second network protocol should be used to transmit the second set of data to the computing device 910.

In one embodiment, if the network component 930 determines that a second network protocol should be used to transmit the second set of data to the computing device 910, the network component 930 may switch to the second network protocol and use the second network protocol to transmit the second set of data to the computing device 910. If the network component 930 determines that a second network protocol should not be used to transmit the second set of data to the computing device 910, the network component 930 continue to use the first network protocol and may use the first network protocol to transmit the second set of data to the computing device 910.

In one embodiment, the first network protocol may be TCP and the second network protocol may be UDP. For example, the data storage system 250 may be using TCP to transmit network packets to the computing device 910. However, the TCP connection between the computing device 910 and the data storage system 250 may have problems or issues (e.g., bad links, faulty networks devices, congestion on a link/connection, etc.). TCP may be a network protocol that incurs a higher overhead, cost, resource usage, etc., than UDP. If the TCP connection between the data storage system 250 and the computing device 910 is not reliable, then it may be better to switch to a lighter weight protocol such as UDP. When switching from TCP to UDP, the network component 930 may close any TCP connections between the computing device 910 and the data storage device 340. Closing the TCP connections may be referred to as terminating the connections, tearing down the connections, etc.

In one embodiment, the first network protocol may be UDP and the second network protocol may be TCP. For example, the data storage system 250 may be using UDP to transmit network packets to the computing device 910. However, the network component 930 may periodically analyze network conditions of the network 950 (e.g., may reanalyze the network conditions of the network 950 every few minutes, few hours, or some other appropriate period of time). If the network conditions of the network 950 have improved, the network component 930 may determine that the TCP protocol should be used. When switching from UDP to TCP, the network component 930 may establish one or more new TCP connections between the computing device 910 and the data storage device 340. The new TCP connections may be used to communicate data (e.g., network packets) between the computing device 910 and the data storage system 250.

As discussed above, the data storage system 250 may be a computing device. A computing device may be a device that may include hardware such as processing devices (e.g., processors, memory (e.g., RAM), storage devices (e.g., HDDs, SSDs), and other hardware devices (e.g., a video card), as discussed above. A computing device may include any suitable type of device or machine that has a programmable processor. The data storage system 250 may also include a VM. A VM may be a software implementation of a computing device) that includes its own operating system (referred to as a guest OS) and executes application programs, applications, software. A VM may execute on a hypervisor which may manage system resources, including access to hardware devices (e.g., a physical processor, a physical memory or storage device, etc.). The hypervisor may also emulate the physical resources or hardware which may be used by the VMs to execute software/applications. The data storage system may also include a container. A container may be an isolated set of resources allocated to executing an application, software, and/or process independent from other applications, software, and/or processes, as discussed above. A container may execute on a container engine which executes on top of the OS for a computing device which may allow different containers to share the host OS (e.g., the OS kernel, binaries, libraries, etc.) of a computing device.

Figure 10:
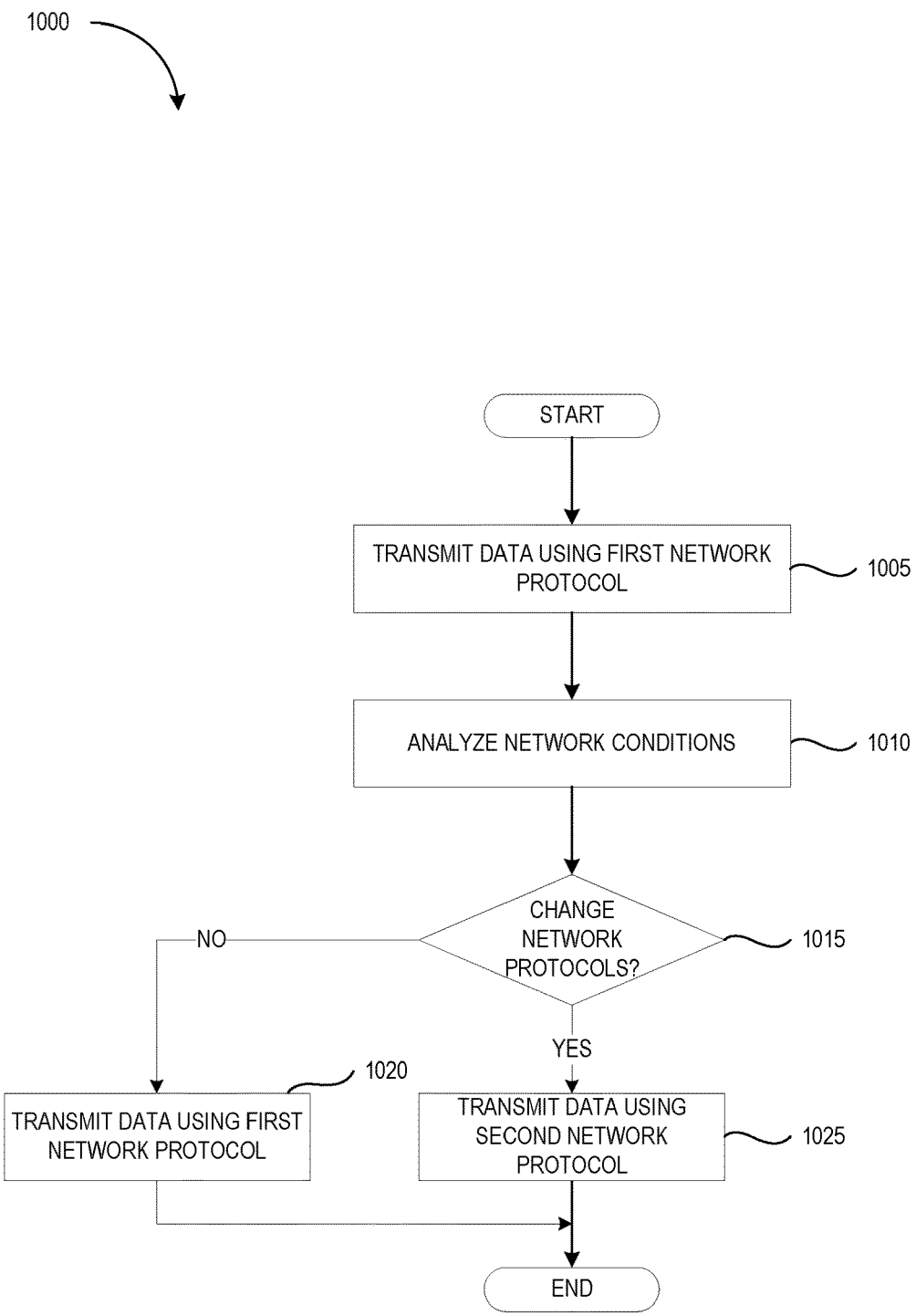
FIG. 10 is a flow diagram of a process for switching network protocols, in accordance with some embodiments of the present disclosure.

FIG. 10 is a flow diagram of a process 1000 of switching network protocols, in accordance with some embodiments. Process 1000 may be performed by processing logic that may comprise hardware (e.g., circuitry, dedicated logic, programmable logic, a processor, a processing device, a central processing unit (CPU), a system-on-chip (SoC), etc.), software (e.g., instructions running/executing on a processing device), firmware (e.g., microcode), or a combination thereof. In some embodiments, the process 1000 may be performed by one or more of a data storage system, an accelerator component, a network component, and/or a computing device.

The process 1000 begins at block 1005, where the process 1000 may transmit data to a computing device using a first network protocol. At block 1010, the process 1000 may analyze one or more network conditions of a network that couples the data storage system and the computing device. For example, the process 1000 may determine one or more of the retransmission rate, the bandwidth/throughput, the transmission delay, etc. At block 1015, the process 1000 may determine whether to change network protocols based on the one or more network conditions. For example, if the retransmission rate is above a threshold, the process 1000 may determine that the network protocol used by the data storage system should be changed.

If the process 1000 determines that the network protocols should be changed, the process 1000 may switch to a second network protocol and may use the second network protocol to transmit network packets at block 1025. If the process 1000 determines that the network protocols should not be changed, the process 1000 may continue using the first network protocol and may transmit network packets using the first network protocol at block 1020.

In some embodiments, the process 1000 may repeat block 1010 through 1025. For example, the process 1000 may periodically analyze network conditions and determine whether the network protocol currently used by the data storage system should be changed. If so, the process 1000 may change the network protocol.

Figure 11:
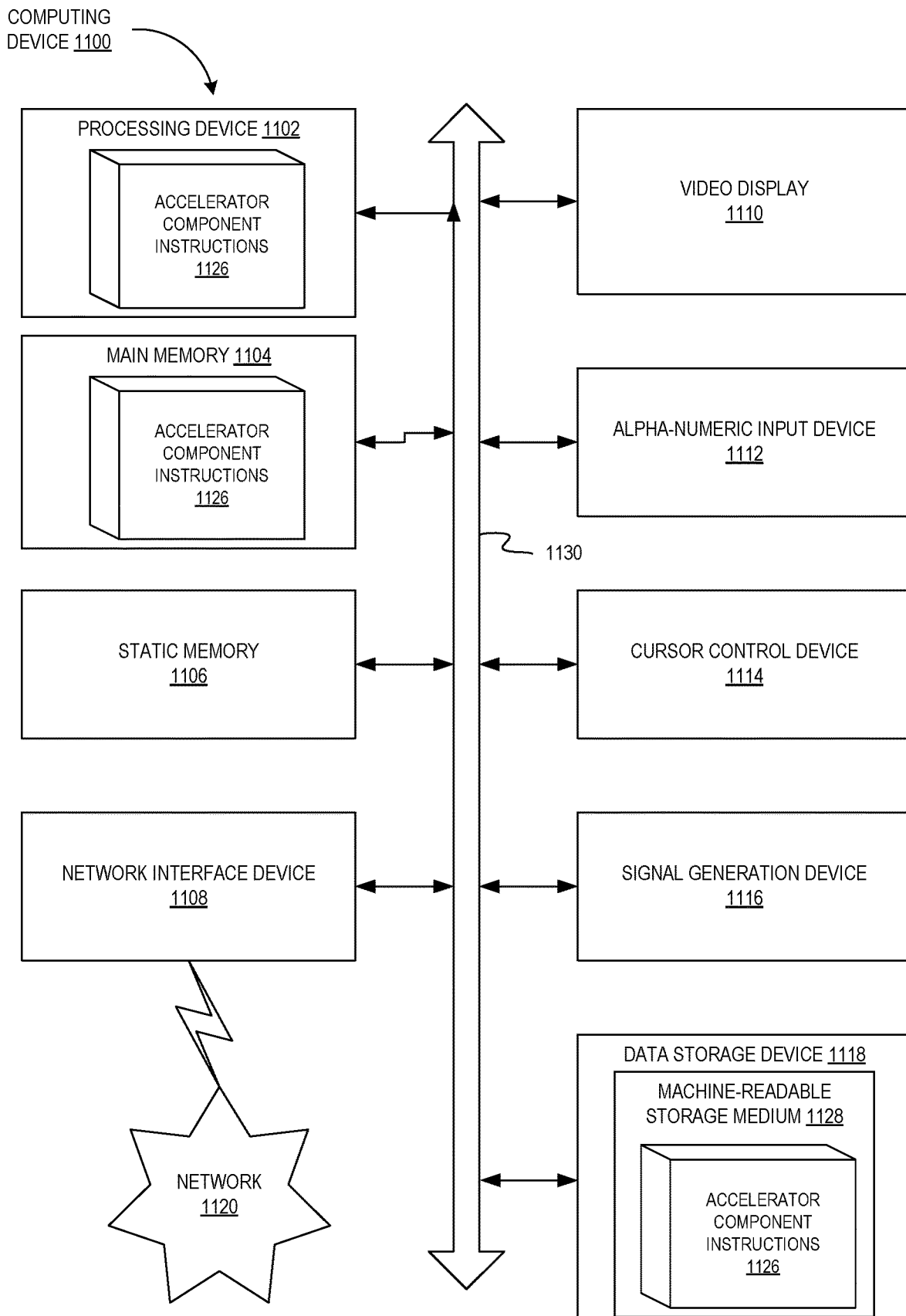
FIG. 11 is a block diagram of an example computing device that may perform one or more of the operations described herein, in accordance with some embodiments of the present disclosure.

FIG. 11 is a block diagram of an example computing device 1100 that may perform one or more of the operations described herein, in accordance with some embodiments. Computing device 1100 may be connected to other computing devices in a LAN, an intranet, an extranet, and/or the Internet. The computing device may operate in the capacity of a server machine in client-server network environment or in the capacity of a client in a peer-to-peer network environment. The computing device may be provided by a personal computer (PC), a set-top box (STB), a server, a network router, switch or bridge, or any machine capable of executing a set of instructions (sequential or otherwise) that specify actions to be taken by that machine. Further, while only a single computing device is illustrated, the term "computing device" shall also be taken to include any collection of computing devices that individually or jointly execute a set (or multiple sets) of instructions to perform the methods discussed herein. In some embodiments, the computing device 1100 may be one or more of an access point and a packet forwarding component.

The example computing device 1100 may include a processing device (e.g., a general purpose processor, a PLD, etc.) 1102, a main memory 1104 (e.g., synchronous dynamic random access memory (DRAM), read-only memory (ROM)), a static memory 1106 (e.g., flash memory and a data storage device 1118), which may communicate with each other via a bus 1130.

Processing device 1102 may be provided by one or more general-purpose processing devices such as a microprocessor, central processing unit, or the like. In an illustrative example, processing device 1102 may comprise a complex instruction set computing (CISC) microprocessor, reduced instruction set computing (RISC) microprocessor, very long instruction word (VLIW) microprocessor, or a processor implementing other instruction sets or processors implementing a combination of instruction sets. Processing device 1102 may also comprise one or more special-purpose processing devices such as an application specific integrated circuit (ASIC), a field programmable gate array (FPGA), a digital signal processor (DSP), network processor, or the like. The processing device 1102 may be configured to execute the operations described herein, in accordance with one or more aspects of the present disclosure, for performing the operations and steps discussed herein.

Computing device 1100 may further include a network interface device 1108 which may communicate with a network 1120. The computing device 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse) and an acoustic signal generation device 1116 (e.g., a speaker). In one embodiment, video display unit 1110, alphanumeric input device 1112, and cursor control device 1114 may be combined into a single component or device (e.g., an LCD touch screen).

Data storage device 1118 may include a computer-readable storage medium 1128 on which may be stored one or more sets of instructions, e.g., instructions for carrying out the operations described herein, in accordance with one or more aspects of the present disclosure. Instructions 1126 implementing one or more of a data storage device, an accelerator component (e.g., an offloading component, an error component, a network component, etc.), may also reside, completely or at least partially, within main memory 1104 and/or within processing device 1102 during execution thereof by computing device 1100, main memory 1104 and processing device 1102 also constituting computer-readable media. The instructions may further be transmitted or received over a network 1120 via network interface device 1108.

While computer-readable storage medium 1128 is shown in an illustrative example to be a single medium, the term "computer-readable storage medium" should be taken to include a single medium or multiple media (e.g., a centralized or distributed database and/or associated caches and servers) that store the one or more sets of instructions. The term "computer-readable storage medium" shall also be taken to include any medium that is capable of storing, encoding or carrying a set of instructions for execution by the machine and that cause the machine to perform the methods described herein. The term "computer-readable storage medium" shall accordingly be taken to include, but not be limited to, solid-state memories, optical media and magnetic media.

Unless specifically stated otherwise, terms such as "receiving," "determining," "providing," "generating," "encoding," "decoding," "retrieving," "transmitting," "verifying," "," "dividing," "analyzing," "establishing," "closing," or the like, refer to actions and processes performed or implemented by computing devices that manipulates and transforms data represented as physical (electronic) quantities within the computing device's registers and memories into other data similarly represented as physical quantities within the computing device memories or registers or other such information storage, transmission or display devices. Also, the terms "first," "second," "third," "fourth," etc., as used herein are meant as labels to distinguish among different elements and may not necessarily have an ordinal meaning according to their numerical designation.

Examples described herein also relate to an apparatus for performing the operations described herein. This apparatus may be specially constructed for the required purposes, or it may comprise a general purpose computing device selectively programmed by a computer program stored in the computing device. Such a computer program may be stored in a computer-readable non-transitory storage medium.

The methods and illustrative examples described herein are not inherently related to any particular computer or other apparatus. Various general purpose systems may be used in accordance with the teachings described herein, or it may prove convenient to construct more specialized apparatus to perform the required method steps. The required structure for a variety of these systems will appear as set forth in the description above.

The above description is intended to be illustrative, and not restrictive. Although the present disclosure has been described with references to specific illustrative examples, it will be recognized that the present disclosure is not limited to the examples described. The scope of the disclosure should be determined with reference to the following claims, along with the full scope of equivalents to which the claims are entitled.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments.

However, the illustrative discussions above are not intended to be exhaustive or to limit the disclosure to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the disclosure is not to be limited to the details given herein, but may be modified within the scope and equivalents of the appended claims.

What is claimed is:

1. A method, comprising:
receiving a first set of data at a data storage system, wherein the data storage system comprises a primary Advanced Reduced Instruction Set Computing (RISC) Machines (ARM) processor and an ARM coprocessor integrated onto a system on a chip (SoC);
analyzing a current load of the primary ARM processor to determine whether to offload checksum computations to the ARM coprocessor;
based on a result of the analyzing, forwarding a first portion of the first set of data to the primary ARM processor to generate a first checksum for the first portion, and forwarding a second portion of the first set of data to the ARM coprocessor to generate a second checksum for the second portion;
storing the first set of data, the first checksum, and the second checksum to a data storage device;
receiving a request for the first set of data stored on the data storage system from a computing device;
retrieving the first set of data the first checksum and the second checksum from the data storage device of the data storage system;
verifying the first set of data using the first checksum and the second checksum to determine whether there are errors in the data;
generating a set of codewords based on the first set of data and an error correction code;
analyzing a packet loss rate of a network used by the data storage system and the computing device;
transmitting a set of network packets to the computing device, wherein each network packet of the set of network packets comprises a single codeword from the set of codewords, and wherein transmitting the set of network packets comprises using a user datagram protocol (UDP) if the packet loss rate is above a threshold and using a transmission control protocol (TCP) if the packet loss rate is below the threshold; and
providing an indicator of a coding function of the error correction code to the computing device, wherein the computing device is configured to decode or error correct the first set of data based on the coding function of the error correction code.

2. The method of claim 1, wherein the first set of data is obtainable by the computing device based on a subset of the set of codewords.

3. The method of claim 1, wherein generating the set of codewords comprises:
dividing the first set of data into multiple portions; and
encoding the multiple portions to generate the set of codewords based on the coding function of the error correction code.

4. The method of claim 1, wherein:
the set of codewords has a first size;
the first set of data has a second size; and
the first size is larger than the second size.

5. The method of claim 1, wherein the error correction code comprises an erasure code.

6. An apparatus, comprising:
a data storage device configured to store data; and
a processing device configured to:
receive a first set of data at a data storage system, wherein the data storage system comprises a primary Advanced Reduced Instruction Set Computing (RISC) Machines (ARM) processor and an ARM coprocessor integrated onto a system on a chip (SoC);
analyze a current load of the primary ARM processor to determine whether to offload checksum computations to the ARM coprocessor;
based on a result of the analysis, forward a first portion of the first set of data to the primary ARM processor to generate a first checksum for the first portion, and forward a second portion of the first set of data to the ARM coprocessor to generate a second checksum for the second portion;
store the first set of data, the first checksum, and the second checksum to a data storage device;
receive a request for the first set of data stored on the data storage system from a computing device;
retrieve the first set of data the first checksum and the second checksum from the data storage device of the data storage system;
verify the first set of data using the first checksum and the second checksum to determine whether there are errors in the data;
generate a set of codewords based on the first set of data and an error correction code;
analyze a packet loss rate of a network used by the data storage system and the computing device;
transmit a set of network packets to the computing device, wherein each network packet of the set of network packets comprises a single codeword from the set of codewords, and wherein the set of network packets are transmitted via a user datagram protocol (UDP) if the packet loss rate is above a threshold and via a transmission control protocol (TCP) if the packet loss rate is below the threshold; and
provide an indicator of a coding function of the error correction code to the computing device, wherein the computing device is configured to decode or error correct the first set of data based on the coding function of the error correction code.

7. The apparatus of claim 6, wherein the first set of data is obtainable by the computing device based on a subset of the set of codewords.

8. The apparatus of claim 6, wherein to generate the set of codewords the processing device is further configured to:
divide the first set of data into multiple portions; and
encode the multiple portions to generate the set of codewords based on the coding function of the error correction code.

9. The apparatus of claim 6, wherein:
the set of codewords has a first size;
the first set of data has a second size; and
the first size is larger than the second size.

10. The apparatus of claim 6, wherein the error correction code comprises an erasure code.

11. A non-transitory computer readable medium having instruction stored thereon that, when executed by a processing device, cause the processing device to:

receive a first set of data at a data storage system, wherein the data storage system comprises a primary Advanced Reduced Instruction Set Computing (RISC) Machines (ARM) processor and an ARM coprocessor integrated onto a system on a chip (SoC);

analyze a current load of the primary ARM processor to determine whether to offload checksum computations to the ARM coprocessor;

based on a result of the analysis, forward a first portion of the first set of data to the primary ARM processor to generate a first checksum for the first portion, and forward a second portion of the first set of data to the ARM coprocessor to generate a second checksum for the second portion;

store the first set of data, the first checksum, and the second checksum to a data storage device;

receive a request for the first set of data stored on the data storage system from a computing device;

retrieve the first set of data the first checksum and the second checksum from the data storage device of the data storage system;

verify the first set of data using the first checksum and the second checksum to determine whether there are errors in the data;

generate a set of codewords based on the first set of data and an error correction code;

analyze a packet loss rate of a network used by the data storage system and the computing device;

transmit a set of network packets to the computing device, wherein each network packet of the set of network packets comprises a single codeword from the set of codewords, and wherein the set of network packets are transmitted via a user datagram protocol (UDP) if the packet loss rate is above a threshold and via a transmission control protocol (TCP) if the packet loss rate is below the threshold; and provide an indicator of a coding function of the error correction code to the computing device, wherein the computing device is configured to decode or error correct the first set of data based on the coding function of the error correction code.

12. The non-transitory computer readable medium of claim 11, wherein generating the set of codewords comprises:

divide the first set of data into multiple portions; and encode the multiple portions to generate the set of codewords based on the coding function of the error correction code.

* * * * *